United States Patent
Kim et al.

(10) Patent No.: US 9,187,694 B2
(45) Date of Patent: Nov. 17, 2015

(54) PHOSPHOR AND METHOD FOR PREPARING SAME

(75) Inventors: Seong Min Kim, Chungcheongnam-do (KR); Hyong Sik Won, Suwon-si (KR); Chan Suk Min, Suwon-si (KR); Chul Soo Yoon, Suwon-si (KR); Youn Gon Park, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 265 days.

(21) Appl. No.: 13/825,014

(22) PCT Filed: Sep. 20, 2011

(86) PCT No.: PCT/KR2011/006929
§ 371 (c)(1),
(2), (4) Date: Jun. 11, 2013

(87) PCT Pub. No.: WO2012/039573
PCT Pub. Date: Mar. 29, 2012

(65) Prior Publication Data
US 2013/0256597 A1    Oct. 3, 2013

(30) Foreign Application Priority Data
Sep. 20, 2010 (KR) .................. 10-2010-0092636

(51) Int. Cl.
 *C09K 11/64* (2006.01)
 *C09K 11/08* (2006.01)
 (Continued)

(52) U.S. Cl.
 CPC ......... *C09K 11/7734* (2013.01); *C09K 11/0883* (2013.01); *C09K 11/7721* (2013.01); *H05B 33/10* (2013.01); *H01L 33/502* (2013.01)

(58) Field of Classification Search
 CPC ........... C09K 11/0883; C09K 11/7721; C09K 11/7734
 USPC ................................... 252/301.4 F
 See application file for complete search history.

(56) References Cited

U.S. PATENT DOCUMENTS

| | | | |
|---|---|---|---|
| 2007/0108896 A1* | 5/2007 | Hirosaki | 313/506 |
| 2008/0001126 A1 | 1/2008 | Hirosaki | |
| 2008/0197321 A1 | 8/2008 | Hirosaki et al. | |
| 2009/0050845 A1 | 2/2009 | Hirosaki et al. | |
| 2010/0213820 A1 | 8/2010 | Sakai et al. | |

FOREIGN PATENT DOCUMENTS

| | | |
|---|---|---|
| CN | 101044223 A | 9/2007 |
| CN | 101175834 A | 5/2008 |

(Continued)

OTHER PUBLICATIONS

International Search Report issued in International Patent Application No. PCT/KR2011/006929 dated Mar. 26, 2012.

(Continued)

*Primary Examiner* — Carol M Koslow
(74) *Attorney, Agent, or Firm* — McDermott Will & Emery LLP

(57) ABSTRACT

According to one example of the present application, a phosphor has the following composition formula (1): [composition formula 1] $Si_{(6-z)}Al_zO_yN_{(8-z)}:Re_x$, where x, y and z are $0.018 \leq x \leq 0.3$, $0.3 \leq y \leq 0.75$, $0.42 \leq z \leq 1.0$, respectively, and Re is a rare earth element. Therefore, even when the aluminum concentration is 0.42 mol to 1.0 mol, a sialon phosphor of the present application exhibits high luminance and has a particle size D50 varying between 5 to 20 μm. In addition, a method for preparing a phosphor according to one example of the present application involves adjusting the oxygen concentration to ensure the superior crystallinity of the phosphor and thus improve the luminance thereof.

26 Claims, 10 Drawing Sheets

(51) Int. Cl.
*H01L 33/00* (2010.01)
*C09K 11/77* (2006.01)
*H05B 33/10* (2006.01)
*H01L 33/50* (2010.01)

(56) References Cited

FOREIGN PATENT DOCUMENTS

| JP | 2005-255895 A | 9/2005 |
| WO | WO-2006/121083 A1 | 11/2006 |

OTHER PUBLICATIONS

R.-J. Xie et al., "Synthesis and Photoluminescence Properties of b-sialon:Eu2+ (Si6-zAlzOzN8-z:Eu2+) A Promising Green Oxynitride Phosphor for White Light-Emitting Diodes", Journal of the Electrochemical Society, vol. 154, No. 10, pp. J314-J319, (2007).

Chinese Office Action issued in Chinese Patent Application No. 2011800554666 dated Apr. 15, 2014, with English Translation.

* cited by examiner

U.S. 9,187,694 B2

PHOSPHOR AND METHOD FOR PREPARING SAME

CROSS-REFERENCE TO RELATED APPLICATIONS

This application is the U.S. National Stage of International Application No. PCT/KR2011/006929, filed Sep. 20, 2011, and claims benefit of priority to Korean Patent Application No. 10-2010-0092636 filed on Sep. 20, 2010, in the Korean Intellectual Property Office, the entire contents of which are hereby incorporated by reference.

TECHNICAL FIELD

The present application relates to a phosphor and a method for preparing the same, and more particularly to a β-sialon phosphor capable of improving luminance and a method for preparing the same.

BACKGROUND

A phosphor is used for a vacuum fluorescent display (VFD), a field emission display (FED), a plasma display panel (PDP), a light emitting display (LED), or the like. To make a phosphor emit light, energy for rendering the phosphor excited is supplied to the phosphor, and the phosphor is excited by an excitation source having high energy, for example, vacuum ultraviolet rays, ultraviolet rays, electron beams, and blue light. However, since the phosphor is deformed by these excitation sources and thus tends to involve a decrease in luminance and to deteriorate, a phosphor having less luminance degradation is required. Accordingly, sialon phosphors, which show a slow decay in luminance, are introduced instead of silicate phosphors, phosphate phosphors, aluminate phosphors, and sulfide phosphors, conventionally used.

A sialon phosphor is a kind of acid nitrides having Si, Al, O, and N and includes an α-sialon phosphor and a β-sialon phosphor which have different crystal structures. Non-patent Literature 1 discloses an α-sialon phosphor, while Patent Documents 1, 2, 3, and 4 disclose an α-sialon phosphor and a light emitting device using the same. Also, Patent Document 5 discloses a β-sialon phosphor, while Patent Document 6 discloses a β-sialon phosphor and a light emitting device using the same.

[Non-patent Literature 1] J. W. H. vankrebel "On new rare earth doped M-Si-Al-O—N materials," Tu Eindhoven The Netherland, P145-161(1998)
[Patent Document 1] JP Patent Publication No. 2002-363554
[Patent Document 2] JP Patent Publication No. 2003-336059
[Patent Document 3] JP Patent Publication No. 2004-238505
[Patent Document 4] JP Patent Publication No. 2007-31201
[Patent Document 5] JP Patent Publication No. S60-206889
[Patent Document 6] JP Patent Publication No. 2005-255895

α-sialon is a crystal structure having a unit structure represented by $Si_{12-(m+n)}Al_{(m+n)}O_nN_{8-n}$, in which two empty spheres are present. Metal ions having a relatively small radius, for example, $Ca^{2+}$, may be engaged in the empty spheres of the crystal structure, and α-sialon engaging the metal ions may be represented by a general formula $M_{m/v}Si_{12-(m+n)}Al_{(m+n)}O_nN_{8-n}$:Eu, wherein M is a metal ion and V is a valence thereof. As stated in Non-patent Literature 1 and Patent Document 1, α-sialon engaging Ca and an active material Eu is known as a phosphor emitting light in a yellow region. Since this phosphor has a continuous excitation band from an ultraviolet region to a blue region and thus emits yellow light by irritation of ultraviolet rays or blue light, the phosphor may be used as a yellow phosphor for a white light emitting device.

This phosphor may be prepared by mixing proper amounts of precursor materials obtained from powders of silicon nitride, aluminum nitride, calcium carbonate ($CaCO_3$), and europium oxide as starting materials and sintering the mixture at a high temperature in a nitrogen atmosphere. Further, a substrate of a high purity material with a limited amount of impurities disclosed in Patent Document 3 or metal silicone disclosed in Patent Document 4 are used so as to achieve high luminance.

Meanwhile, β-sialon is represented by a general formula $Si_{6-x}Al_xO_xN_{6-x}$. Patent Documents 5 and 6 disclose a β-sialon phosphor prepared by adding an active material to β-sialon. Patent Document 5 discloses a β-sialon phosphor obtained using μ-sialon and an active material, for example, Cu, Ag, or a rare-earth element such as Eu. However, it is reported that a Eu-activated β-sialon phosphor of Patent Document 5 emits light in a blue wavelength region from 410 nm to 440 nm, while a phosphor disclosed in Patent Document 6 is a green phosphor. Difference in emission color between the phosphors is probably due to a fact, as mentioned in Patent Document 6, that the active material Eu is not securely engaged in β-sialon since the Eu-activated β-sialon of Patent Document 5 has a low sintering temperature.

A Eu-activated β-sialon phosphor of Patent Document 6 emits green light and is excited by light in a blue wavelength region. Thus, the Eu-activated β-sialon phosphor attracts attention as a green light emitting phosphor for a white light emitting device, which is constituted by a blue light emitting device and a phosphor or by an ultraviolet light emitting device and a phosphor. In particular, the Eu-activated β-sialon phosphor has a narrow spectrum width of about 55 nm and good color purity and thus is expected to be used as a green phosphor for a white light emitting device requiring color reproducibility. However, since the Eu-activated β-sialon phosphor does not have sufficiently high luminance, enhancement of luminance is necessary.

A β-sialon phosphor is also prepared by mixing proper amounts of materials obtained from powders of silicon nitride, aluminum nitride, and an active material as starting materials and sintering the mixture at a high temperature in a nitrogen atmosphere. However, a β-sialon phosphor obtained by a currently known method using nitrides, such as silicon nitride or aluminum nitride, as a starting material does not have a sufficiently high luminance.

That is, in a conventional method of synthesizing a rare-earth element added β-sialon phosphor, raw materials including oxides and nitrides, such as $Si_3N_4$, $SiO_2$, AlN, $Al_2O_3$, and $Eu_2O_3$, are mixed, and synthesized at 1,900° C. or higher in a nitrogen atmosphere. However, when β-sialon is synthesized by mixing a rare-earth element used as a bivalent cation activator in mixing the raw materials, other cations than Si and Al, which form sialon, may serve as impurities, degrading crystallinity of β-sialon, which may cause a decrease in luminance of the phosphor.

Further, as described above, although a yellow YAG phosphor is applied to a light emitting device to realize a white light emitting device for the first time, the white light emitting device shows a low color rendering index (CRI) as compared with a common lamp. Thus, a white light emitting device having an improved CRI by using green and red phosphors has been recently developed. As a green phosphor applied to the device, a silicate phosphor or a sulfide phosphor is used. However, such phosphors exhibit low high-temperature, thermal, and chemical stabilities, and thus a phosphor using nitrides is vigorously studied. Since a nitride phosphor is obtained by adding an activator to a host material, such as $Si_3N_4$ and sialon used for a high-temperature structure materials, the phosphor has superior color reproducibility and reliability for display and excellent high-temperature light emitting characteristics and thus is applied to a TV backlight and a lighting lamp. However, this phosphor has 70% or less of efficiency than the YAG phosphor, and thus improvement in efficiency is needed.

SUMMARY

An aspect of the present application provides a phosphor and a method for preparing the same.

According to an aspect of the present application, there is provided a phosphor represented by Formula 1:

$$Si_{(6-z)}Al_zO_yN_{(8-z)}:Re_x, \quad\quad \text{[Formula 1]}$$

where $0.018 \le x \le 0.3$, $0.3 \le y \le 0.75$, $0.42 \le z \le 1.0$, and Re is a rare-earth element.

z may be 0.50 to 0.75.

z may be 0.60 to 0.70.

The phosphor may have a peak emission wavelength of 500 to 550 nm when irradiated by an excitation source.

The phosphor may have a peak emission wavelength of 535 to 545 nm when irradiated by an excitation source.

The phosphor may have a particle size D50 of 5 to 20 μm.

The excitation source may have a peak emission wavelength of 300 to 480 nm.

The rare-earth element may be selected from the group consisting of Eu and Ce.

The phosphor may further include an alkaline earth metal selected from the group consisting of magnesium (Mg), calcium (Ca), strontium (Sr), and barium (Ba).

The phosphor may further include manganese (Mn).

According to another aspect of the present application, there is provided a method for preparing a phosphor. The method includes generating a first mixture by mixing a silicon precursor, an aluminum precursor, and an active material precursor. The oxygen concentration is adjusted by oxidizing the first mixture. The oxidized first mixture is sintered in a nitrogen atmosphere. The phosphor is represented by Formula 1:

$$Si_{(6-z)}Al_zO_yN_{(8-z)}:Re_x, \quad\quad \text{[Formula 1]}$$

where $0.018 \le x \le 0.3$, $0.3 \le y \le 0.75$, $0.42 \le z \le 1.0$, and Re is a rare-earth element contained in the active material precursor.

The phosphor may have a peak emission wavelength of 500 to 550 nm when irradiated by an excitation source.

The phosphor may have a peak emission wavelength of 535 to 545 nm when irradiated by an excitation source.

The step of adjusting of the oxygen concentration may be carried out such that oxygen concentration satisfies a condition: (aluminum concentration−0.1)≤oxygen concentration≤ (aluminum concentration+0.1).

The silicon precursor may be selected from the group consisting of metallic silicon and silicon nitride.

The aluminum precursor may be selected from the group consisting of metallic aluminum, aluminum nitride, and aluminum hydroxide.

The rare-earth element may be selected from the group consisting of Eu and Ce.

The oxidizing step of the first mixture may be carried out at a temperature of 300 to 1,300° C. in an oxygen or air atmosphere.

The sintering step may be carried out at a temperature of 1,500 to 2,200° C.

The sintering step may be carried out at a pressure of nitrogen gas of 0.1 to 10 MPa.

The phosphor may have a particle size D50 of 5 to 20 μm.

According to still another aspect of the present application, there is provided a method for preparing a phosphor. The method includes generating a first mixture by mixing silicon oxide, aluminum oxide, and an active material precursor while adjusting oxygen concentration. The first mixture is sintered in a nitrogen atmosphere. The phosphor is represented by Formula 1:

$$Si_{(6-z)}Al_zO_yN_{(8-z)}:Re_x, \quad\quad \text{[Formula 1]}$$

where $0.018 \le x \le 0.3$, $0.3 \le y \le 0.75$, $0.42 \le z \le 1.0$, and Re is a rare-earth element contained in the active material precursor.

The step of adjusting of the oxygen concentration may be carried out such that oxygen concentration satisfies a condition: (aluminum concentration−0.1)≤oxygen concentration≤ (aluminum concentration+0.1).

The rare-earth element may be selected from the group consisting of Eu and Ce.

The sintering step may be carried out at a temperature 1,500 to 2,200° C.

The sintering step may be carried out at a pressure of nitrogen gas of 0.1 to 10 MPa.

The phosphor may have a particle size D50 of 5 to 20 μm.

According to an example of the present application, a phosphor is represented by Formula 1:

$$Si_{(6-z)}Al_zO_yN_{(8-z)}:Re_x, \quad\quad \text{[Formula 1]}$$

where $0.018 \le x \le 0.3$, $0.3 \le y \le 0.75$, $0.42 \le z \le 1.0$, and Re is a rare-earth element.

Thus, the present application provides a sialon phosphor which exhibits high luminance and has a particle size D50 varying between 5 to 20 μm even when aluminum concentration is 0.42 mol to 1.0 mol.

Further, in a method for preparing a phosphor according to an example of the present application, oxygen concentration is adjusted to ensure superior crystallinity of the phosphor and thus improve luminance thereof.

Finally, the phosphor according to the example of the present application may exhibit excellent green light emitting property, not allow a particle size thereof to grow larger, enable control of the particle size, and improve luminance even when aluminum concentration is high.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF DRAWINGS

The above and other aspects, features and other advantages of the present application will be more clearly understood from the following detailed description taken in conjunction with the accompanying drawings, in which.

DETAILED DESCRIPTION

Figure 1:
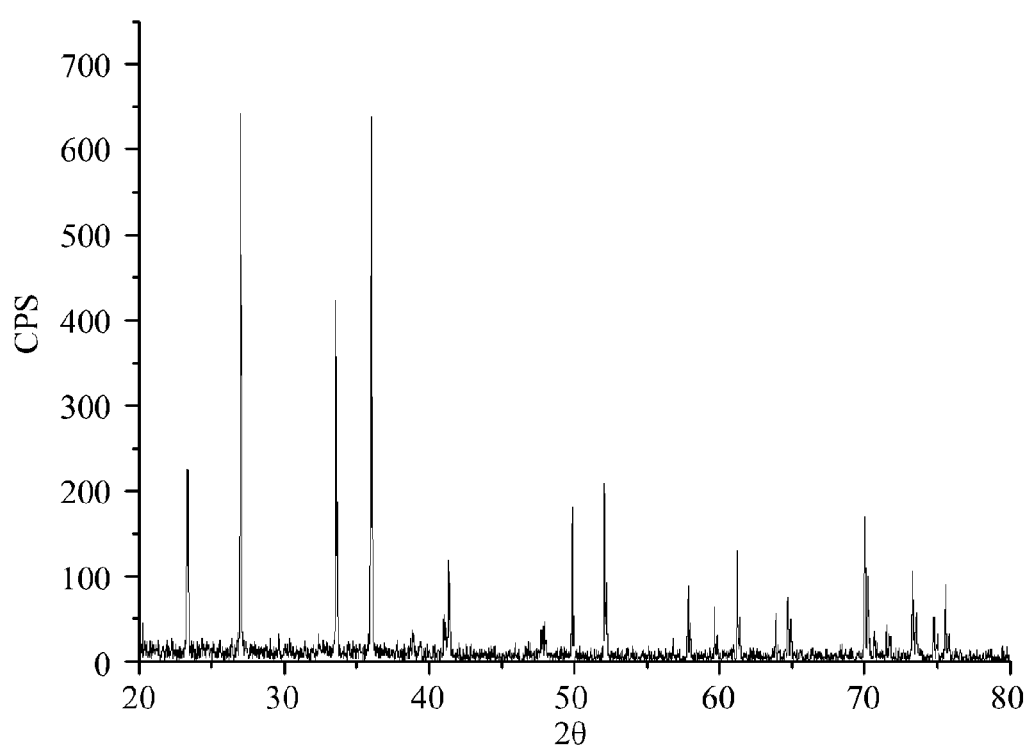
FIG. 1 is a graph illustrating XRD of sialon phosphors prepared in one of Example 1 and Comparative Example 1.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Hereinafter, a phosphor and a method for preparing the same according to an example of the present application will be described with reference to the accompanying drawings. The phosphor according to the example is a β-sialon phosphor, which may be referred to as various terms in the specification, for example, a phosphor and a sialon phosphor.

The phosphor according to the example of the present application is represented by Formula 1:

$$Si_{(6-z)}Al_zO_yN_{(8-z)}:Re_x,$$ [Formula 1]

where 0.018≤x≤0.3, 0.3≤y≤0.75, 0.42≤z≤1.0, and Re is a rare-earth element.

The phosphor may exhibit excellent green light emitting property, control a particle size thereof to a small level, and improve luminance even when aluminum concentration is high.

In Formula 1, z is preferably 0.5 mol to 0.75 mol, more preferably 0.60 mol to 0.70 mol.

Even when the aluminum concentration is 0.42 or higher, the phosphor emits light with a peak emission wavelength in a range of 500 to 550 nm when irradiated by an excitation source with a peak emission wavelength in a range of 300 to 480 nm, which shows excellent green light emitting property. Further, when the excitation source is irradiated, the peak emission wavelength may be 535 to 545 nm, preferably 540 to 542.5 nm.

In addition, even when the aluminum concentration is 0.42 mol to 1.0 mol, a particle size D50 of the sialon phosphor may be controlled in a range of 5 to 20 μm. That is, when the aluminum concentration is high, the particle size becomes large to increase porosity, thus reducing luminance. However, in the present example, the sialon phosphor is formed with a small particle size even at an aluminum concentration of 0.42 to 1.0, thereby preventing a decrease in luminance.

Further, the sialon phosphor according to the present example has luminance improved by 12.5% or higher at an aluminum concentration of 0.42 mol to 1.0 mol as compared with a sialon phosphor having an aluminum concentration of 0.23 mol (1.64 mol %). Accordingly, the luminance of the phosphor is improved at the above rate, and thus a light emitting device using the phosphor according to the present example may achieve high conversion efficiency.

Thus, the sialon phosphor according to the present example has high light emitting properties and excellent thermal and chemical stabilities as compared with a conventional sialon phosphor with z<0.35. Thus, a white light emitting device with high output/high reliability may be prepared.

In the sialon phosphor according to the present example, the rare-earth element may be selected from the group consisting of Eu and Ce. Eu may be derived from europium oxide ($Eu_2O_3$) as a EU containing compound, while Si may be derived from silicon oxide ($SiO_2$) or silicon nitride ($Si_3N_4$) as a Si containing compound. Further, Al may be derived from aluminum nitride (AlN) or aluminum oxide ($Al_2O_3$) as an Al containing compound. The oxygen concentration is adjusted by oxidizing a mixture of raw materials, after mixing the raw materials, when silicon nitride and aluminum nitride are used. Alternatively, the oxygen concentration is adjusted by adjusting amounts of silicon oxide and aluminum oxide when silicon oxide and aluminum oxide are used.

The sialon phosphor according to the present example is a compound represented by $Si_{(6-x)}Al_xO_yN_{(8-y)}:Re_z$, obtained by adding aluminum nitride to a composition of silicon nitride and europium oxide. Here, x and z may be values selected from the conditions: 0.018≤x≤0.3 and 0.42≤z≤1.0, respectively. In particular, the sialon phosphor having a concentration with z of 0.42 or higher is generally known to show a decrease in green light emitting property and to have a large particle size. However, as described above, even at an aluminum concentration of 0.42 or higher, the sialon phosphor according to the present example has excellent green light emitting property, does not allow the particle size thereof to grow larger, controls the particle size, and improves luminance by adjusting concentrations of oxygen, Re, and aluminum.

Moreover, the sialon phosphor according to the present example may further include an alkaline earth metal containing compound or a manganese (Mn) containing compound. Alkaline earth metal may be selected from the group consisting of magnesium (Mg), calcium (Ca), strontium (Sr), and barium (Ba).

In the sialon phosphor including the alkaline earth metal containing compound or manganese containing compound, alkaline earth metal or manganese does not substitute silicon or aluminum forming a host matrix but is added as a dopant to an empty sphere of a crystal structure. Ultimately, in one example, addition of an alkaline earth metal or manganese contributes to phase stabilization of the sialon phosphor, thereby improving reliability, enhancing light emitting efficiency, and shortening a wavelength of light, without deforming or affecting the crystal structure of the host matrix.

Hereinafter, a method for preparing a sialon phosphor according to an example of the present application will be described.

The method for preparing the sialon phosphor according to the example of the present application includes generating a first mixture by mixing a silicon precursor, an aluminum precursor, and an active material precursor. The oxygen concentration is adjusted by oxidizing the first mixture. The oxidized first mixture is sintered in a nitrogen atmosphere.

A sialon phosphor prepared by the method for preparing the sialon phosphor according to the present example is represented by Formula 1:

$$Si_{(6-z)}Al_zO_yN_{(8-z)}:Re_x, \qquad \text{[Formula 1]}$$

where $0.018 \leq x \leq 0.3$, $0.3 \leq y \leq 0.75$, $0.42 \leq z \leq 1.0$, and Re is a rare-earth element contained in the active material precursor.

In Formula 1, $Si_{(6-z)}Al_zO_yN_{(8-z)}:Re_x$ z is preferably 0.5 to 0.75, more preferably 0.60 to 0.70.

Even when an aluminum concentration is 0.42 or higher, the sialon phosphor prepared by the exemplary method emits light with a peak emission wavelength in a range of 500 to 550 nm when irradiated by an excitation source with a peak wavelength in a range of 300 to 480 nm, which shows excellent green light emitting property. Also, when this excitation source is irradiated, the peak emission wavelength may be 535 to 545 nm, preferably 540 to 542.5 nm.

Furthermore, the sialon phosphor prepared according to the present example may have luminance improved by 12.5% or higher in an aluminum concentration of 0.42 mol to 1.0 mol as compared with a sialon phosphor having an aluminum concentration of 0.23 mol. Accordingly, due to the improvement in the luminance of the phosphor, a light emitting device using the phosphor according to the present example may achieve high conversion efficiency.

Moreover, in an aluminum concentration of 0.42 mol to 1.0 mol, the sialon phosphor may have a particle size D50 controlled to 5 to 20 µm.

The silicon precursor may include metallic silicon or a silicon compound. As the silicon precursor, metallic silicon may be used alone or in combination with a silicon compound. The silicon compound may be silicon nitride.

The metallic silicon is preferably high purity powdery metallic silicon with a low content of impurities, such as Fe. A particle diameter or distribution of metallic silicon powder does not have a direct impact on a particle system of the phosphor. However, depending on sintering conditions or mixed raw materials, the particle diameter or distribution of the silicon powder exerts an impact not only on characteristics of the phosphor regarding particle size, such as a particle diameter or shape, but also on light emitting properties of the phosphor, and thus the metallic silicon powder preferably has a particle diameter of 300 µm or less.

Since the metallic silicon shows a higher reactivity with a smaller particle diameter, the metallic silicon preferably has smaller particles in view of reactivity. However, reactivity is also dependent on mixed raw materials or a sintering rate, and thus the metallic silicon does not necessarily have a small particle diameter and is not limited to a powder form.

The aluminum precursor may include metallic aluminum or an aluminum compound. As the aluminum precursor, metallic aluminum may be used alone or in combination with an aluminum compound. The aluminum compound may be selected from the group consisting of aluminum nitride and aluminum hydroxide.

When the silicon precursor is metallic silicon, the aluminum precursor may not necessarily be metallic aluminum but may be an aluminum compound alone.

When the metallic aluminum is used, high purity powdery metallic aluminum with a low content of impurities, such as Fe, is preferable. As mentioned above, the metallic aluminum also preferably has a particle diameter of 300 µm or less. However, since reactivity is also dependent on mixed raw materials or a sintering rate, the metallic aluminum does not necessarily have a small particle diameter and is not limited to a powder form.

The rare-earth element as an active material may be selected from the group consisting of Eu, Ce, Pr, Nd, Sm, Gd, Tb, Dy, Ho, Er, Tm, and Yb. Preferably, the rare-earth element is Eu or Ce. The active material precursor may include oxides, such as $Eu_2O_3$, $Sm_2O_3$, $Yb_2O_3$, CeO, $Pr_7O_{11}$ and $Tb_3O_4$, $Eu(NO_3)_3$, EuN, or $EuCl_3$.

As described above, the silicon precursor, the aluminum precursor, and the active material precursor are measured and mixed into a first mixture. Subsequently, the first mixture is oxidized to adjust an oxygen concentration and sintered in a nitrogen atmosphere, thereby preparing a sialon phosphor.

Since the first mixture does not include oxygen, the first mixture is subjected to oxidation at a temperature of 300 to 1,300° C. in an oxygen or air atmosphere, thereby adjusting the oxygen concentration. Here, the oxygen concentration may be adjusted to satisfy a condition: (aluminum concentration−0.1)≤oxygen concentration≤(aluminum concentration+0.1). In this way, the first mixture not including oxygen is formed and then subjected to oxidation, thereby providing a uniform oxygen concentration.

That is, an oxygen gas serves as an oxygen supply source in the oxygen or air atmosphere. Here, silicon, aluminum, and the active material react with each other during oxidation, so that the sialon phosphor may obtain a uniform composition. Ultimately, as oxygen concentration is uniformly adjusted in the sialon phosphor, the sialon phosphor is not partially crystallized but entirely crystallized to enhance crystallinity, thus improving luminance.

The oxidized first mixture is sintered at a temperature of 1,500 to 2,200° C. and a pressure of nitrogen gas of 0.1 to 10 MPa. Sintering may be carried out by tamping the sorted first mixture powder in a boron nitride (BN) crucible. Here, the nitrogen containing atmosphere preferably has an $N_2$ gas concentration of 90% or higher. The nitrogen atmosphere may be formed by creating a vacuum state and then introducing a nitrogen containing gas. Alternatively, the nitrogen atmosphere may be formed by introducing a nitrogen containing gas without creation of a vacuum state, in which introduction of the gas may be discontinuously conducted.

In one example of the present application, the method for preparing the phosphor may further include heat-treating the sintered phosphor in a reducing atmosphere in order to accelerate reduction of europium oxide ($Eu_2O_3$). In the reducing atmosphere, a mixture of an $N_2$ gas with $H_2$, CO, or $NH_3$ may be used, wherein concentration of $H_2$, CO, or $NH_3$ added to the $N_2$ gas may be 0.1 to 10%. Heat treatment in the reducing atmosphere may be carried out at a temperature of 1,000 to 1,700° C. for about 1 to 20 hours.

Alternatively, a method for preparing a sialon phosphor according to an example of the present application includes generating a first mixture by mixing silicon oxide, aluminum oxide, and an active material precursor while adjusting oxygen concentration, and sintering the oxidized first mixture in a nitrogen atmosphere.

A sialon phosphor prepared by this method is represented by Formula 1:

$$Si_{(6-z)}Al_zO_yN_{(8-z)}:Re_x, \qquad \text{[Formula 1]}$$

where $0.018 \leq x \leq 0.3$, $0.3 \leq y \leq 0.75$, $0.42 \leq z \leq 1.0$, and Re is a rare-earth element contained in the active material precursor.

This method may correspond to mixing the precursors, oxidizing the mixture, and adjusting an oxygen concentration. That is, an oxide is used as a precursor material to adjust the oxygen concentration, and thus the oxygen concentration may be adjusted in forming the first mixture. In this way, a uniform concentration of oxygen may also be provided. Accordingly, as the oxygen concentration is uniformly adjusted in the sialon phosphor, the sialon phosphor is not partially crystallized, but entirely crystallized to enhance crystallinity, thus improving luminance. In addition, oxygen concentration may be adjusted by various methods, without being limited to the foregoing examples.

A method of mixing the silicon precursor, the aluminum precursor, and the active material precursor after measurement may be one of dry mixing and wet mixing.

First, according to a wet mixing method, the silicon precursor, the aluminum precursor, and the active material precursor, which are measured, balls to aid in mixing and grinding the precursors, and a solvent were mixed. Here, the balls may be silicon oxide ($Si_3N_4$), alumina ($Al_2O_3$) or zirconia ($ZrO_2$) balls, or balls generally used for mixing ingredients. The solvent may be deionized (DI) water, alcohols, such as ethanol, or organic solvents, such as n-hexane. That is, after putting the precursors, the solvent, and the balls in a container, the container is sealed, followed by homogenous mixing for about 0.1 to 100 hours using a miller or the like. When mixing is completed, a first mixture is separated from the balls and dried in an oven for about 1 to 30 hours to evaporate the solvent mostly. Then, the dried powder is uniformly ground using a micrometer-sized sieve of metal or polymer.

Meanwhile, according to a dry mixing method, the precursors are put in a container without a solvent and homogenously mixed using a milling machine. Mixing is carried out for about 0.1 to 1 hour, in which the balls are added along with the precursors for ease of mixing, thereby reducing a mixing time. The dry mixing method may reduce a total process time as compared with the wet mixing method since a drying process of a solvent is not involved. After the precursors are mixed, the resulting powder may be uniformly ground using a desired micrometer-sized sieve of metal or polymer in the same manner as in the wet mixing method.

In the present application, even when aluminum concentration is 0.42 mol to 1.0 mol, the sialon phosphor exhibits high luminance and has a particle size D50 in a range of 5 to 20 μm.

Further, in the method of preparing the phosphor according to the example of the present application, oxygen concentration is adjusted to secure excellent crystallinity of the phosphor, thereby improving luminance.

Ultimately, the sialon phosphor according to the example of the present application may exhibit excellent green light emitting property, not allow a particle size thereof to grow larger, enable control of the particle size, and improve luminance even when aluminum concentration is high.

In addition, in mixing the silicon precursor, the aluminum precursor, and the active material precursor, an alkaline earth metal containing compound or manganese (Mn) containing compound may be further mixed therewith. Alkaline earth metal may be selected from the group consisting of magnesium (Mg), calcium (Ca), strontium (Sr), and barium (Ba).

When the alkaline earth metal containing compound or manganese containing compound is further added in mixing the precursors, alkaline earth metal or manganese does not substitute silicon or aluminum forming the host matrix, but is added as a dopant to the empty sphere of the crystal structure. Ultimately, in one example, addition of alkaline earth metal or manganese neither deforms nor affects the crystal structure of the host matrix.

Further, the alkaline earth metal or manganese contributes to phase stabilization of the sialon phosphor, thereby improving reliability, enhancing light emitting efficiency, and shortening a wavelength of light.

The alkaline earth metal or manganese may be added in an amount of 0.0001 to 10 mol %. When the amount of alkaline earth metal or manganese is less than 0.1 mol %, improvement in efficiency and a wavelength shortening effect are not sufficiently achieved. When the amount of alkaline earth metal or manganese is greater than 3 mol %, the phosphor has reduced efficiency as compared with a phosphor without such materials. Preferably, the amount of alkaline earth metal or manganese is 0.05 to 0.5 mol %.

In particular, the phosphor including alkaline earth metal or manganese shows luminance enhanced about 10% higher than a phosphor without alkaline earth metal or manganese, thus achieving high conversion efficiency.

Light emitted from the phosphor by irradiation of an excitation source has a peak wavelength of 535 to 545 nm, which tends to be relatively shortened. Thus, the phosphor may satisfy characteristics of green wavelengths required in standard RGB to a comparatively high extent. That is, when the light emitted from the phosphor by irradiation of the excitation source is expressed as (x, y) in a CIE 1931 chromaticity diagram, x and y satisfy x≤0.36 and y≥0.61, respectively, and thus the phosphor may be used effectively as a green phosphor providing vivid white light.

Hereinafter, the present application will be explained with reference to the following examples. These examples are provided for illustrative purposes only and are not to be in any way construed as limiting the present application.

In the following examples, a silicon precursor, an aluminum precursor, and an active material precursor were measured and mixed by a ball mill or a mixer, thereby preparing a first mixture. The first mixture was oxidized at 300 to 1,300° C. in an oxygen or air atmosphere, and put in a container resistant to a high temperature, such as a BN crucible, which was put in an electric furnace where pressure firing and vacuum firing were conducted. The oxidized first mixture was subjected to heat treatment at 1,000° C. or higher and a gas pressure of 0.1 MPa to 10 MPa in a nitrogen containing atmosphere by elevating temperature at 10° C./min or less, thereby preparing a sialon phosphor.

The silicon precursor, the aluminum precursor, and the active material precursor were mixed by changing a mixed ratio, followed by oxidation and sintering, thereby preparing Eu-activated sialon phosphors according to Examples 1 to 13, Comparative Example 1 where aluminum concentration is 0.23 mol, and Comparative Example 2 where oxygen concentration is different.

Example 1

Silicon nitride ($Si_3N_4$) was used as a silicon precursor, and aluminum nitride (AlN) and aluminum oxide ($Al_2O_3$) were used as an aluminum precursor. Further, europium oxide ($Eu_2O_3$) was used as an active material. 179.98 g of $Si_3N_4$, 5.9418 g of AlN, 16.4493 g of $Al_2O_3$, and 3.4187 g of $Eu_2O_3$ were mixed using a mixer and a sieve and tamped into a BN crucible, which was set in a pressure-resistant electric furnace. For sintering, the electric furnace was heated to 500° C. in a vacuum state and supplied with an $N_2$ gas at 500° C. The mixture was sintered at 2,050° C. for 5 hours in an $N_2$ gas atmosphere by elevating temperature at 10° C./min from 500° C. to 2,050° C. and maintaining a gas pressure of 1 MPa or higher. Then, the mixture was cooled, and the crucible was taken out of the electric furnace. The resulting sialon phosphor was ground and subjected to a 100-mesh sieve.

Example 2

A sialon phosphor was prepared in the same manner as in Example 1 except that 186.70 g of $Si_3N_4$, 3.1655 g of $Eu_2O_3$, 8.3598 g of AlN, and 6.1066 g of $Al_2O_3$ were used.

Example 3

A sialon phosphor was prepared in the same manner as in Example 1 except that 185.02 g of $Si_3N_4$, 3.2921 g of $Eu_2O_3$, 7.8143 g of AlN, and 8.6189 g of $Al_2O_3$ were used.

Example 4

A sialon phosphor was prepared in the same manner as in Example 1 except that 183.34 g of $Si_3N_4$, 3.2921 g of $Eu_2O_3$, 7.2982 g of AlN, and 11.0946 g of $Al_2O_3$ were used.

Example 5

A sialon phosphor was prepared in the same manner as in Example 1 except that 181.66 g of $Si_3N_4$, 3.0388 g of $Eu_2O_3$, 6.5463 g of AlN, and 13.8636 g of $Al_2O_3$ were used.

Example 6

A sialon phosphor was prepared in the same manner as in Example 1 except that 178.29 g of $Si_3N_4$, 3.4187 g of $Eu_2O_3$, 5.3668 g of AlN, and 18.9983 g of $Al_2O_3$ were used.

Example 7

A sialon phosphor was prepared in the same manner as in Example 1 except that 177.89 g of $Si_3N_4$, 3.8261 g of $Eu_2O_3$, 5.1235 g of AlN, and 21.3340 g of $Al_2O_3$ were used.

Example 8

A sialon phosphor was prepared in the same manner as in Example 1 except that 177.89 g of $Si_3N_4$, 3.8261 g of $Eu_2O_3$, 5.1235 g of AlN, and 21.3340 g of $Al_2O_3$ were used.

Example 9

A sialon phosphor was prepared in the same manner as in Example 1 except that 11.8836 g of AlN and 9.0590 g of $Al_2O_3$ were used.

Example 10

A sialon phosphor was prepared in the same manner as in Example 1 except that 10.1585 g of AlN and 11.2046 g of $Al_2O_3$ were used.

Example 11

A sialon phosphor was prepared in the same manner as in Example 1 except that 8.1460 g of AlN and 13.7078 g of $Al_2O_3$ were used.

Example 12

A sialon phosphor was prepared in the same manner as in Example 1 except that 6.0376 g of AlN and 16.3301 g of $Al_2O_3$ were used.

Example 13

A sialon phosphor was prepared in the same manner as in Example 1 except that 4.2168 g of AlN and 18.5949 g of $Al_2O_3$ were used.

Comparative Example 1

Silicon nitride ($Si_3N_4$) was used as a silicon precursor, and aluminum nitride (AlN) was used as an aluminum precursor. Further, europium oxide ($Eu_2O_3$) was used as an active material. 194.10 g of $Si_3N_4$, 6.7822 g of AlN, and 2.2791 g of $Eu_2O_3$ were mixed using a mixer and a sieve and tamped into a BN crucible, which was set in a pressure-resistant electric furnace. For sintering, the electric furnace was heated to 500° C. in a vacuum state and supplied with an $N_2$ gas at 500° C. The mixture was sintered at 2,050° C. for 5 hours in an $N_2$ gas atmosphere by elevating temperature at 10° C./min from 500° C. to 2,050° C. and maintaining a gas pressure of 1 MPa or higher. Then, the mixture was cooled, and the crucible was taken out of the electric furnace. The resulting sialon phosphor was ground and subjected to a 100-mesh sieve.

Comparative Example 2

A sialon phosphor was prepared in the same manner as in Comparative Example 1 except that 179.98 g of $Si_3N_4$, 1.3417 g of AlN, 22.1708 g of $Al_2O_3$, and 3.4187 g of $Eu_2O_3$ were used.

Compositions of raw materials used in Examples 1 to 8 and Comparative Example 1 are illustrated in Table 1.

TABLE 1

| Example No. | $Si_3N_4$ (g) | $Eu_2O_3$ (g) | AlN (g) | $Al_2O_3$ (g) | Al concentration (mol %) |
|---|---|---|---|---|---|
| Example 1 | 179.98 | 3.4187 | 5.9418 | 16.4493 | 4.643 |
| Example 2 | 186.70 | 3.1655 | 8.3598 | 6.1066 | 3.214 |
| Example 3 | 185.02 | 3.2921 | 7.8143 | 8.6189 | 3.571 |
| Example 4 | 183.04 | 3.2921 | 7.2982 | 11.0946 | 3.929 |
| Example 5 | 181.66 | 3.0388 | 6.5463 | 13.8636 | 4.283 |
| Example 6 | 178.29 | 3.4187 | 5.3668 | 18.9983 | 5.000 |
| Example 7 | 177.89 | 3.8261 | 5.1235 | 21.3340 | 5.357 |
| Example 8 | 169.42 | 3.8261 | 1.8712 | 34.6147 | 7.140 |
| Comparative Example 1 | 194.10 | 2.2791 | 6.7822 | 0.0000 | 1.643 |

Further, luminance, peak emission wavelength, and full width at half maximum (FWHM) of the phosphors according to Examples 1 to 8 and Comparative Example 1 are listed in Table 2. Luminance is expressed as a relative value based on that of the phosphor according to Comparative Example 1.

TABLE 2

| Example No. | Luminance (%) | Peak emission wavelength (nm) | FWHM (nm) |
|---|---|---|---|
| Example 1 | 117.3 | 541.5 | 52.6 |
| Example 2 | 116.87 | 541.5 | 53.1 |
| Example 3 | 117.54 | 542.6 | 53.7 |
| Example 4 | 114.51 | 541.5 | 53.7 |
| Example 5 | 115.50 | 542.0 | 52.5 |
| Example 6 | 117.57 | 542.1 | 53.0 |
| Example 7 | 113.43 | 540.6 | 53.1 |
| Example 8 | 112.5 | 543.3 | 54.1 |
| Comparative Example 1 | 100.00 | 539.5 | 51 |

Further, compositions of raw materials used in Examples 9 to 13 and Comparative Example 2 and oxygen concentrations are illustrated in Table 3.

TABLE 3

| Example No. | Si$_3$N$_4$ (g) | Eu$_2$O$_3$ (g) | AlN (g) | Al$_2$O$_3$ (g) | Oxygen concentration (mol %) |
|---|---|---|---|---|---|
| Example 9 | 179.98 | 3.4187 | 11.8836 | 9.0590 | 3.60 |
| Example 10 | 179.98 | 3.4187 | 10.1585 | 11.2046 | 3.90 |
| Example 11 | 179.98 | 3.4187 | 8.1460 | 13.7078 | 4.24 |
| Example 12 | 179.98 | 3.4187 | 6.0376 | 16.3301 | 4.60 |
| Example 13 | 179.98 | 3.4187 | 4.2168 | 18.5949 | 4.91 |
| Comparative Example 2 | 179.98 | 3.4187 | 1.3417 | 22.1708 | 5.40 |

The phosphors prepared in Example 1 and Comparative Example 1 were analyzed by powder X-ray diffraction (XRD), and analysis results of one of Example 1 and Comparative Example 1 are shown in FIG. 1. As both results of Example 1 and Comparative Example 1 are identical, the analysis results are shown in a single pattern in FIG. 1. The prepared phosphors are identified as a sialon phosphor with reference to FIG. 1 and Joint Committee on Powder Diffraction Standards (JCPDS) data.

Figure 2:
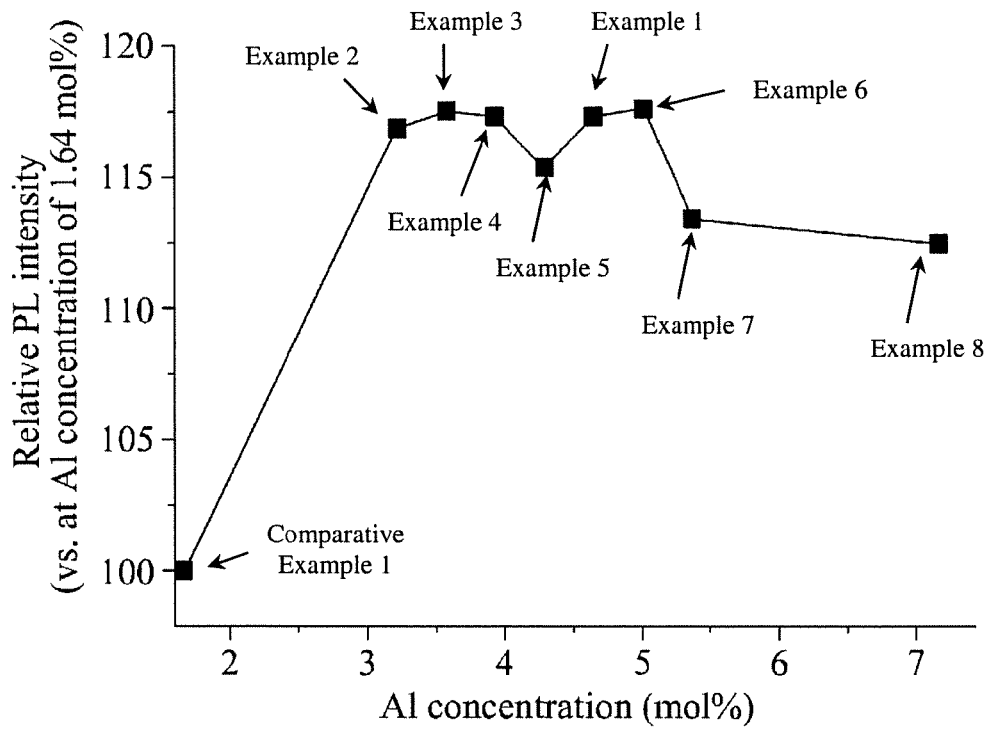
FIG. 2 is a graph illustrating relative photoluminescence (PL) intensities of sialon phosphors prepared in Examples 1 to 8 based on that of Comparative Example 1.
Figure 3:
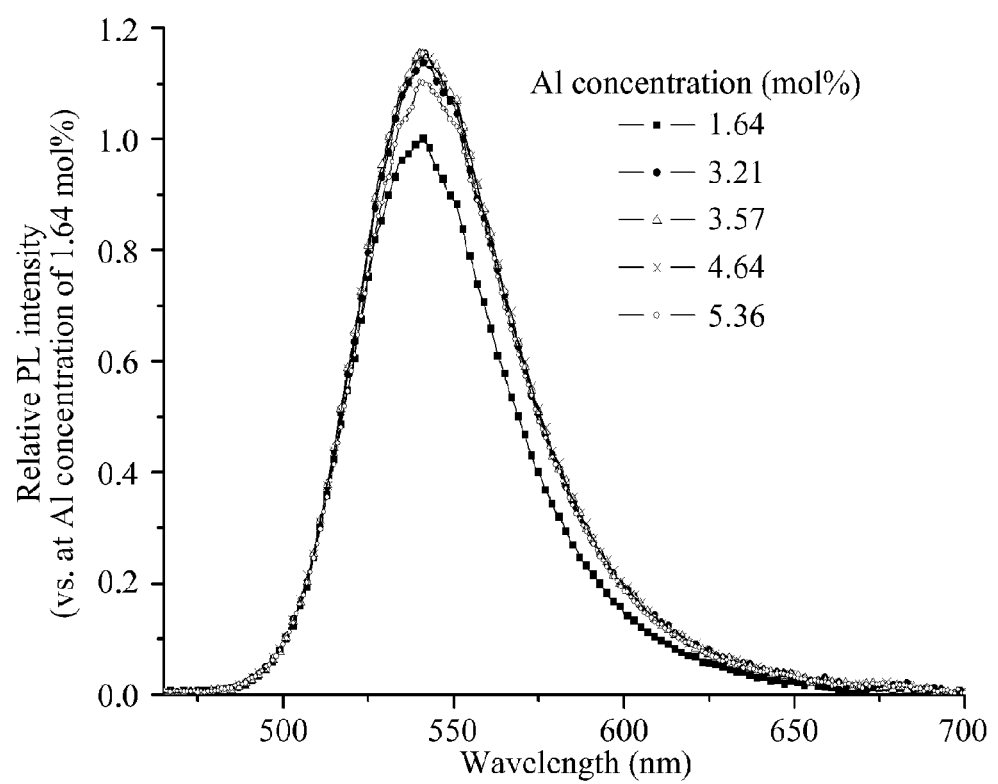
FIG. 3 is a graph illustrating relative PL intensities of the sialon phosphors prepared in Examples 1 to 8 according to an emission wavelength based on that of Comparative Example 1.
Figure 4:
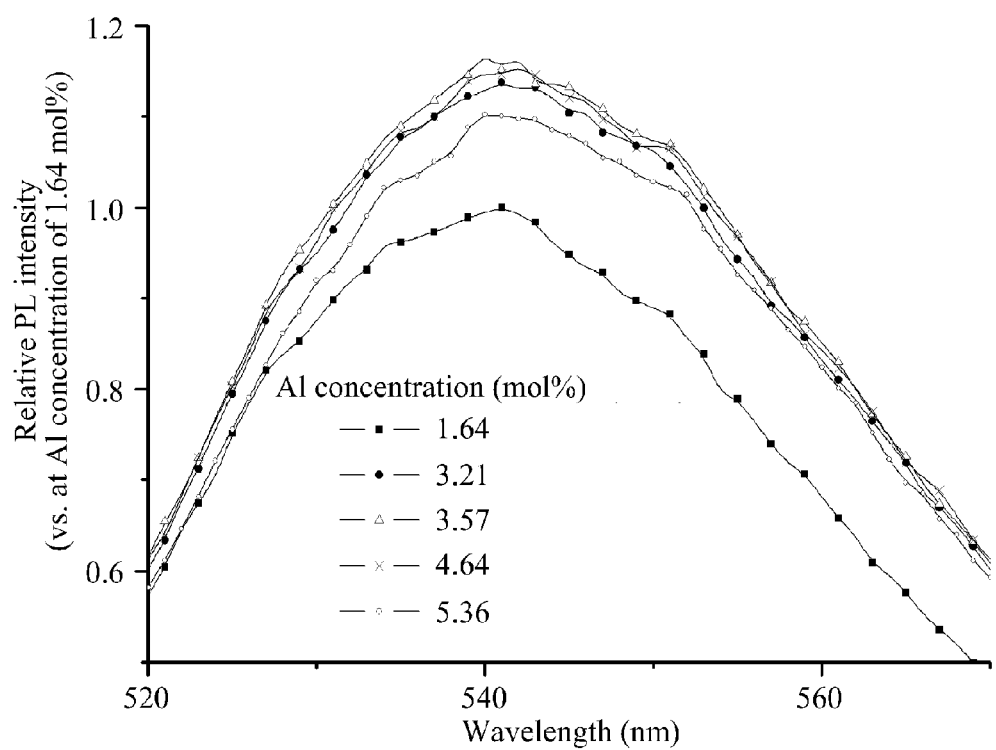
FIG. 4 is a graph enlarging an area in an emission wavelength of 520 to 570 nm of FIG. 3.

FIG. 2 is a graph illustrating relative PL intensities of the sialon phosphors prepared in Examples 1 to 8 based on that of Comparative Example 1. FIG. 3 is a graph illustrating relative PL intensities of the sialon phosphors prepared in Examples 1 to 8 according to an emission wavelength based on that of Comparative Example 1. FIG. 4 is a graph enlarging an area in an emission wavelength of 520 to 570 nm of FIG. 3.

Referring to FIG. 2, the sialon phosphors having an aluminum concentration of 0.45 to 1.0 mol (Examples 1 to 8) show PL intensities improved 12.5% or higher as compared with the sialon phosphor having an aluminum concentration of 0.23 mol of Comparative Example 1. That is, the sialon phosphors of Examples 1 to 8 show luminance improved 12.5 to 20% or higher, as compared with the sialon phosphor having an aluminum concentration of 0.23 mol of Comparative Example 1, even with a higher aluminum concentration. Referring to FIGS. 3 and 4, illustrating relative PL intensities according to an emission wavelength, the sialon phosphors of Examples 1 to 8 have higher relative PL intensities in a wavelength of 540 to 542.5 nm than the sialon phosphor of Comparative Example 1.

Figure 5:
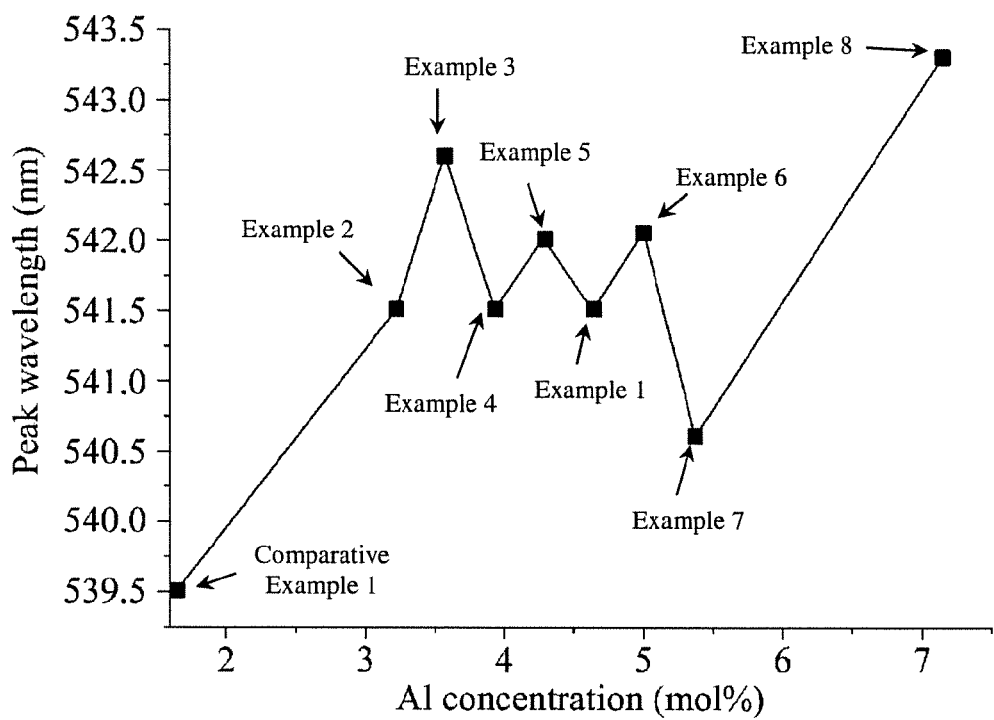
FIG. 5 is a graph illustrating peak emission wavelengths of the sialon phosphors of Examples 1 to 8 and Comparative Example 1.

FIG. 5 is a graph illustrating peak emission wavelengths of the sialon phosphors of Examples 1 to 8 and Comparative Example 1. The sialon phosphors of Examples 1 to 8 and Comparative Example 1 have a peak emission wavelength of 540 to 542.5, which is stable.

Figure 6:
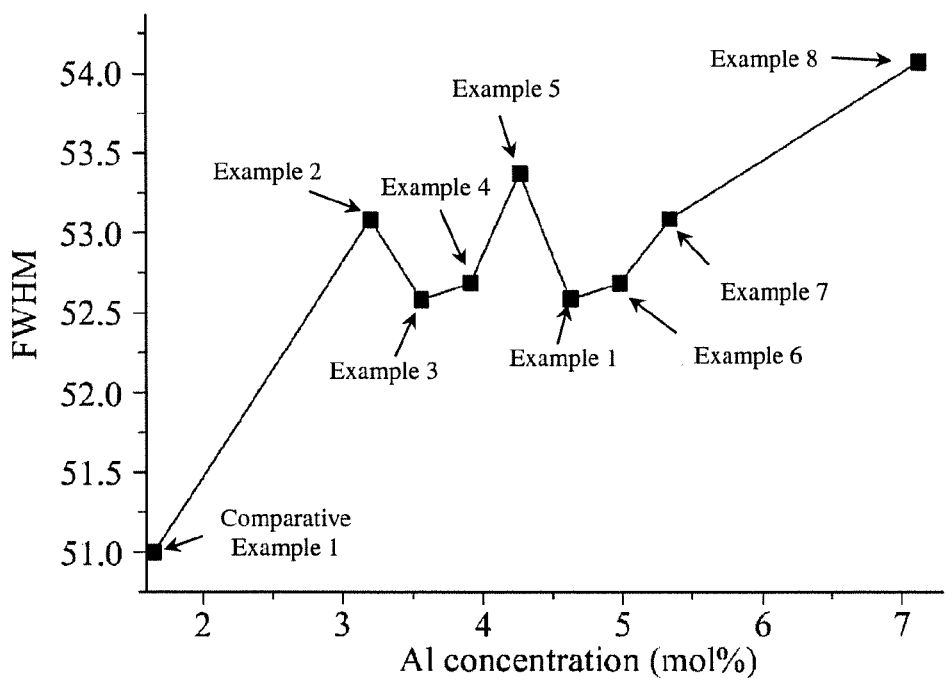
FIG. 6 is a graph illustrating full width at half maximum (FWHM) of the sialon phosphors of Examples 1 to 8 and Comparative Example 1.

FIG. 6 is a graph illustrating full width at half maximum (FWHM) of the sialon phosphors of Examples 1 to 8 and Comparative Example 1. The sialon phosphors of Examples 1 to 8 and Comparative Example 1 have an FWHM of 52 to 53.5 at an aluminum concentration of 0.42 or higher, which is stable.

Figure 7:
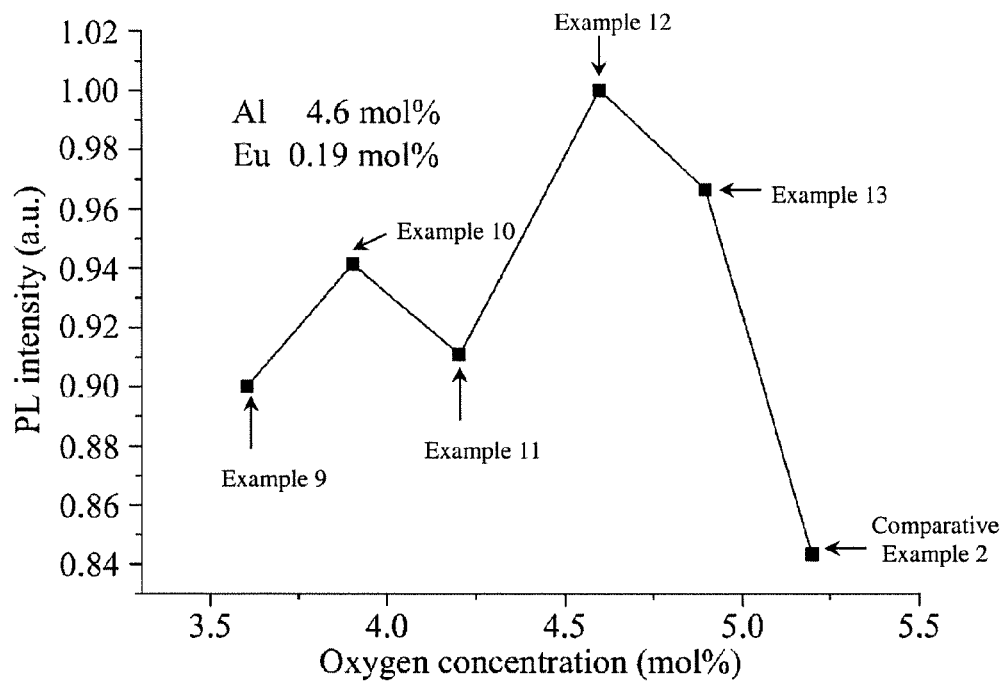
FIG. 7 is a graph illustrating PL intensities of sialon phosphors of Examples 9 to 13 and Comparative Example 2 according to oxygen concentration.
Figure 8:
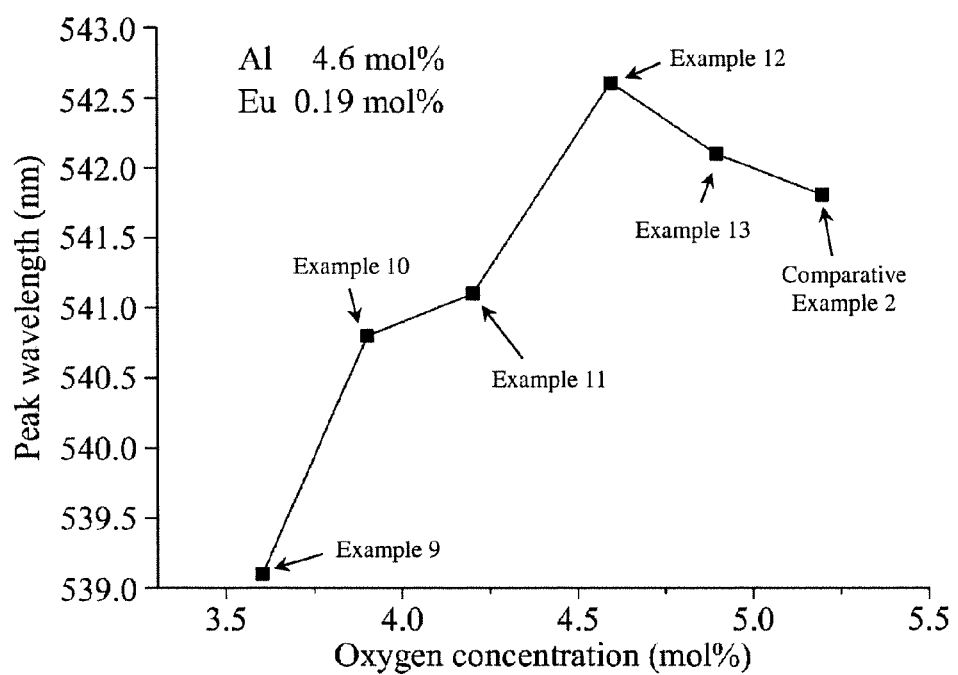
FIG. 8 is a graph illustrating peak emission wavelengths of the sialon phosphors of Examples 9 to 13 and Comparative Example 2 according to oxygen concentration.

FIG. 7 is a graph illustrating PL intensities of the sialon phosphors of Examples 9 to 13 and Comparative Example 2 according to oxygen concentration. FIG. 8 is a graph illustrating peak emission wavelengths of the sialon phosphors of Examples 9 to 13 and Comparative Example 2 according to oxygen concentration.

Referring to FIG. 7, the PL intensities change according to the oxygen concentration at an aluminum concentration of 0.65 mol and a europium concentration of 0.027 mol. Further, a highest PL intensity appears when oxygen concentration is similar to aluminum concentration. That is, the PL intensities are high when oxygen concentration satisfies a condition: (aluminum concentration−0.1)≤oxygen concentration≤(aluminum concentration+0.1).

Also, referring to FIG. 8, the peak emission wavelengths change according to oxygen concentration at an aluminum concentration of 0.65 mol and a europium concentration of 0.027 mol. In the same manner as in FIG. 7, a highest peak emission wavelength is about 542.5 when oxygen concentration is similar to aluminum concentration.

The oxygen concentration may be adjusted by oxidizing the precursors after mixing or by using oxides as the precursors. Thus, as oxygen concentration is uniformly adjusted in the sialon phosphors, the sialon phosphors are not partially crystallized but entirely crystallized to enhance crystallinity, thus improving luminance.

Figure 9A:
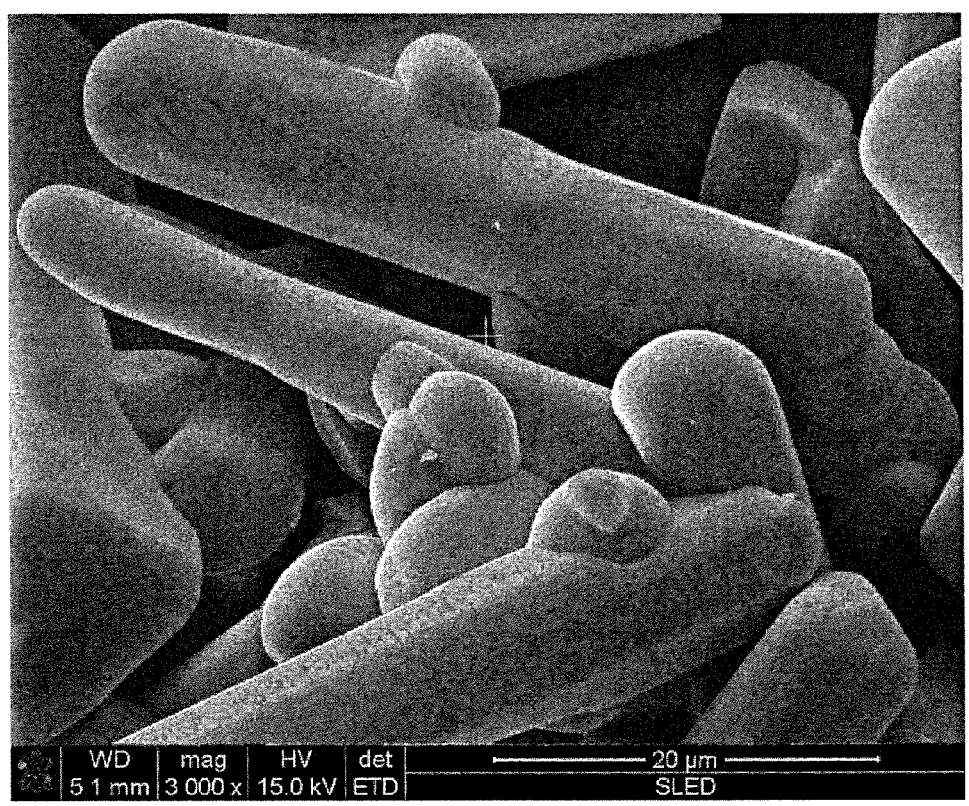
FIG. 9a is a scanning electron micrograph (SEM) of particles of the sialon phosphor according to Comparative Example 2.
Figure 9B:
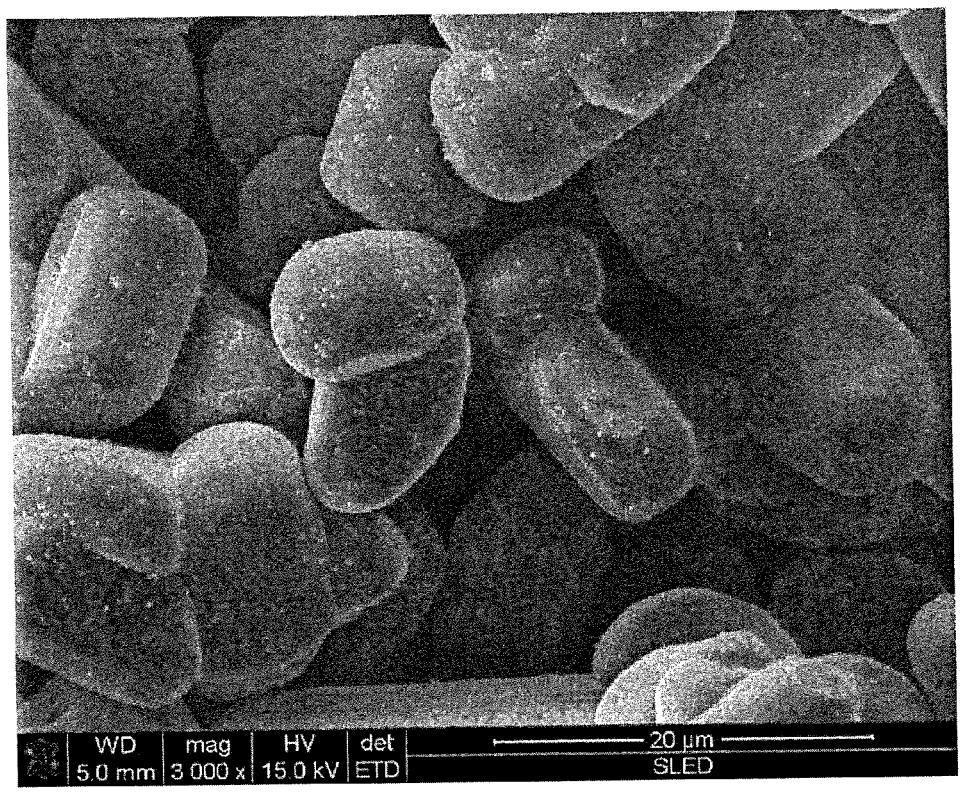
FIG. 9b is an SEM of particles of the sialon phosphor according to Example 13.

FIG. 9a is a scanning electron micrograph (SEM) of particles of the sialon phosphor according to Comparative Example 2, and FIG. 9b is an SEM of particles of the sialon phosphor according to Example 13.

FIGS. 9a and 9b show that a particle size of the phosphors changes according to the oxygen concentration. Referring to FIGS. 9a and 9b, when oxygen concentration is excessive, the particle size grows larger, so that the particles are coarse. That is, the oxygen concentration is 5.400 mol % in FIG. 9a, at which D50 is 25 μm, while the oxygen concentration is 4.616 mol % in FIG. 9b, at which D50 is 15 μm. Therefore, D50 is smaller when oxygen concentration is similar to aluminum concentration.

In conclusion, the phosphors according to the example of the present application are synthesized to have a particle size D50 of 5 to 20 μm and an average particle diameter of about 10 μm at oxygen concentration with respect to the highest PL intensity, so that the phosphors may be applied to a light emitting device.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The invention claimed is:

1. A phosphor being represented by Formula 1:

$$Si_{(6-z)}Al_zO_yN_{(8-z)}:Re_x,$$ [Formula 1]

where 0.018≤x≤0.3, 0.3≤y≤0.75, 0.42≤z≤1.0, and Re is a rare-earth element, wherein the phosphor further includes an alkaline earth metal selected from the group consisting of magnesium (Mg), calcium (Ca), strontium (Sr), and barium (Ba).

2. The phosphor of claim 1, wherein z is 0.50 to 0.75.

3. The phosphor of claim 2, wherein z is 0.60 to 0.70.

4. The phosphor of claim 1, wherein the phosphor has a peak emission wavelength of 500 to 550 nm when irradiated by an excitation source.

5. The phosphor of claim 4, wherein the peak emission wavelength is 535 to 545 nm.

6. The phosphor of claim 1, wherein the phosphor has a particle size D50 of 5 to 20 μm.

7. The phosphor of claim 5, wherein the excitation source has a peak emission wavelength of 300 to 480 nm.

8. The phosphor of claim 1, wherein the rare-earth element is selected from the group consisting of Eu and Ce.

9. The phosphor of claim 1, wherein the phosphor further comprises manganese (Mn).

10. A method for preparing a phosphor, the method comprising steps of:
generating a first mixture by mixing a silicon precursor, an aluminum precursor, and an active material precursor;
adjusting an oxygen concentration by oxidizing the first mixture; and
sintering the oxidized first mixture in a nitrogen atmosphere, wherein the phosphor is represented by Formula 1:

$$Si_{(6-z)}Al_zO_yN_{(8-z)}:Re_x,$$ [Formula 1]

where $0.018 \leq x \leq 0.3$, $0.3 \leq y \leq 0.75$, $0.42 \leq z \leq 1.0$, and Re is a rare-earth element contained in the active material precursor.

11. The method of claim 10, wherein the phosphor has a peak emission wavelength of 500 to 550 nm when irradiated by an excitation source.

12. The method of claim 11, wherein the peak emission wavelength is 535 to 545 nm.

13. The method of claim 11, wherein the step of adjusting the oxygen concentration satisfies a condition: (aluminum concentration−0.1)≤oxygen concentration≤(aluminum concentration+0.1).

14. The method of claim 10, wherein the silicon precursor is selected from the group consisting of metallic silicon and silicon nitride.

15. The method of claim 10, wherein the aluminum precursor is selected from the group consisting of metallic aluminum, aluminum nitride, and aluminum hydroxide.

16. The method of claim 10, wherein the rare-earth element is selected from the group consisting of Eu and Ce.

17. The method of claim 10, wherein the oxidizing of the first mixture is carried out at a temperature of 300 to 1,300° C. in an oxygen or air atmosphere.

18. The method of claim 10, wherein the sintering step is carried out at a temperature of 1,500 to 2,200° C.

19. The method of claim 10, wherein the sintering step is carried out at a pressure of nitrogen gas of 0.1 to 10 MPa.

20. The method of claim 10, wherein the phosphor has a particle size D50 of 5 to 20 μm.

21. A method for preparing a phosphor, the method comprising steps of:
generating a first mixture by mixing silicon oxide, aluminum oxide, and an active material precursor while adjusting an oxygen concentration by adjusting amounts of the silicon oxide and the aluminum oxide; and
sintering the first mixture in a nitrogen atmosphere, wherein:
the phosphor is represented by Formula 1:

$$Si_{(6-z)}Al_zO_yN_{(8-z)}:Re_x,$$ [Formula 1]

where $0.018 \leq x \leq 0.3$, $0.3 \leq y \leq 0.75$, $0.42 \leq z \leq 1.0$, and Re is a rare-earth element contained in the active material precursor.

22. The method of claim 21, wherein the step of adjusting the oxygen concentration satisfies a condition: (aluminum concentration−0.1)≤oxygen concentration≤(aluminum concentration+0.1).

23. The method of claim 21, wherein the rare-earth element is selected from the group consisting of Eu and Ce.

24. The method of claim 21, wherein the sintering step is carried out at a temperature of 1,500 to 2,200° C.

25. The method of claim 21, wherein the sintering step is carried out at a pressure of nitrogen gas of 0.1 to 10 MPa.

26. The method of claim 21, wherein the phosphor has a particle size D50 of 5 to 20 μm.

* * * * *